United States Patent [19]
Pöhlmann

[11] Patent Number: 6,091,266
[45] Date of Patent: Jul. 18, 2000

[54] CIRCUIT ARRANGEMENT FOR A DIGITAL CIRCUIT USING DIFFERENTIAL LOGIC

[75] Inventor: Wolfgang Pöhlmann, Hemmingen, Germany

[73] Assignee: Alcatel, Paris, France

[21] Appl. No.: 09/150,689

[22] Filed: Sep. 10, 1998

[30] Foreign Application Priority Data

Sep. 12, 1997 [DE] Germany ............... 197 40 108

[51] Int. Cl.[7] .................................. H03K 19/082
[52] U.S. Cl. .................. 326/126; 326/18; 326/75; 326/89
[58] Field of Search .................. 326/89–90, 124, 326/126, 18, 26, 80, 75

[56] References Cited

U.S. PATENT DOCUMENTS

| | | |
|---|---|---|
| 4,527,078 | 7/1985 | Smith . |
| 4,978,871 | 12/1990 | Jordan . |
| 5,068,550 | 11/1991 | Barre .......................................... 326/18 |
| 5,485,106 | 1/1996 | Drost et al. ............................... 326/18 |
| 5,530,444 | 6/1996 | Tice et al. ................................ 341/156 |

OTHER PUBLICATIONS

U. Tietze et al, "Halbeiter–Schaltungstechnik", 8th Ed., Springer–Verlag Berlin, 1986, pp. 56–59.

*Primary Examiner*—Jon Santamauro

[57] ABSTRACT

Circuits using differential logic are employed in high-speed optical communications systems. An essential problem in the design of large-scale integrated circuits for this purpose is the control of undesired heat generation, so that the circuits should have low power consumption. According to the invention, a reduction in power consumption is achieved by reducing the number of stages connected in parallel with respect to the power supply. To accomplish this, part of the parallel-connected stages are connected in series with the remaining part of the parallel-connected stages, so that the total number of parallel branches is reduced.

3 Claims, 3 Drawing Sheets

CIRCUIT ARRANGEMENT FOR A DIGITAL CIRCUIT USING DIFFERENTIAL LOGIC

BACKGROUND OF THE INVENTION

1. Technical Field

This invention relates to a circuit arrangement for a digital circuit using differential logic, particularly for emitter followers. Emitter followers are generally known as basic circuits, cf. Tietze, Schenk: Halbleiter-Schaltungstechnik, 8th Edition, Springer-Verlag Berlin, 1986, pages 56 to 59. This basic circuit is used to provide isolation between subcircuits or as a level shifter.

2. Discussion of Related Art

In circuit arrangements for optical communications systems operating at high data rates, for example 10 Gb/s, use is made of emitter followers in differential logic as are shown in FIG. 1 as a series combination of three switching stages 1, 2, 3. Logic signals "0" or "1" are applied to the inputs inp and inn of a switching stage in complementary form, so that the power consumption of an emitter-follower pair so driven is constant regardless of the information content of the signal to be transmitted. Such a constant power consumption is particularly advantageous at high transmission speeds, as disturbances caused by switching operations are thus minimized and, on the other hand, electromagnetic interference with the environment is greatly reduced even at high transmission speeds if a constant electromagnetic field is present.

As it is desirable to keep the heat generated in integrated circuits for optical communications systems to a minimum, there is a need for a circuit arrangement using differential logic which has a lower power consumption than prior-art circuits.

In the circuit arrangement shown in FIG. 3, showing examples of prior art component values, it would be possible to reduce the power consumption by making the resistors R1, R2, R3, R4, R5, R6 in the switching stages 1, 2, 3 larger, but this measure would result in the transistors T1, T2, T3, T4, T5, T6 being operated below the optimum current density, so that their switching speed would decrease; in addition, the voltage swing of the switching stages 1, 2, 3 would become smaller, so that the effect of noise and the sensitivity to interference would increase.

SUMMARY OF INVENTION

The object of the invention is to provide a circuit arrangement using differential logic and having a low power consumption without reducing the switching speed of the circuit and without increasing its sensitivity to interference. In addition, the requirement that the collector-emitter punch-through voltage of semiconductors in modern high-speed technologies should be kept very low, for example at 3V, is to be met.

According to the invention, a circuit arrangement for a digital circuit using differential logic, comprising a plurality of cascade-connected switching stages comprising parallel-connected current paths, is characterized in that at least one of the switching stages is connected in series with a further switching stage while maintaining the magnitudes of the supply voltage, the input voltages, and the output voltages, so that the number of parallel-connected current paths is reduced.

The gist of the invention consists in the fact that a reduction in power consumption is achieved while the circuit properties remain unchanged.

BRIEF DESCRIPTION OF THE DRAWINGS

The invention will become more apparent from the following description of an embodiment when taken in conjunction with the accompanying drawings, in which.

DETAILED DESCRIPTION OF PREFERRED EMBODIMENTS

Figure 1:
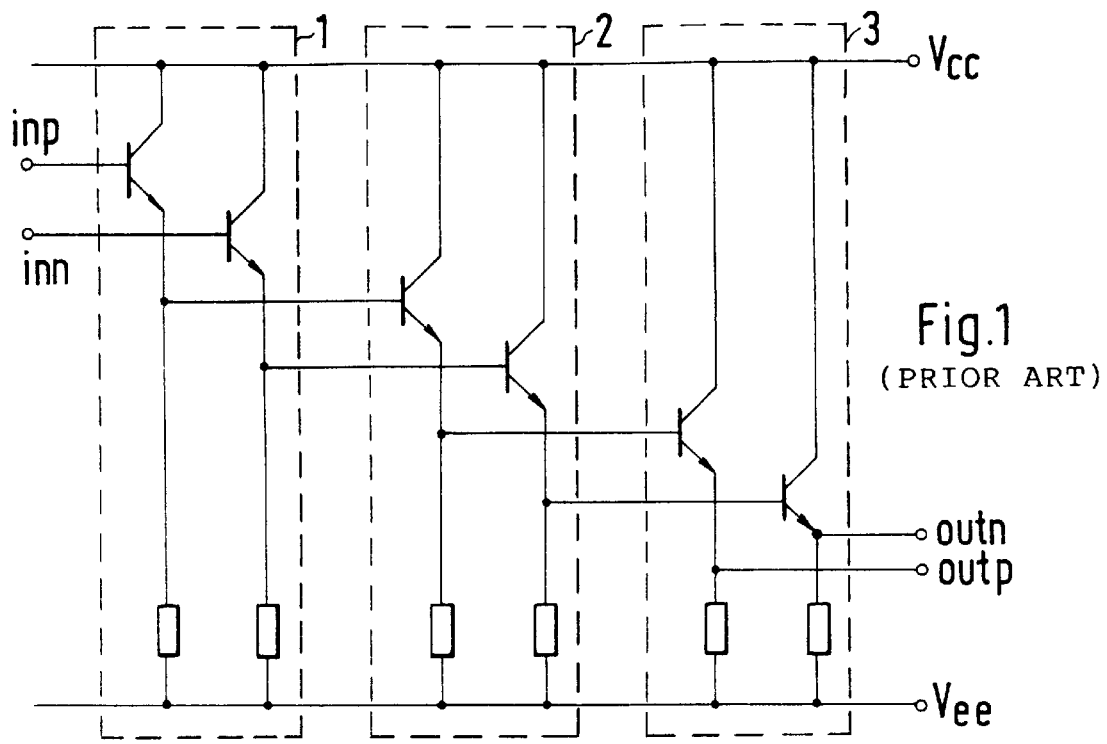
FIG. 1 is a schematic diagram of a prior-art circuit arrangement.

As shown in FIG. 1, a prior-art circuit arrangement using differential logic comprises a parallel combination of, e.g., three emitter followers 1, 2, 3 with inputs inp and inn, outputs outn and outp, and supply voltage terminals $V_{cc}$ and $V_{ee}$.

Figure 2:
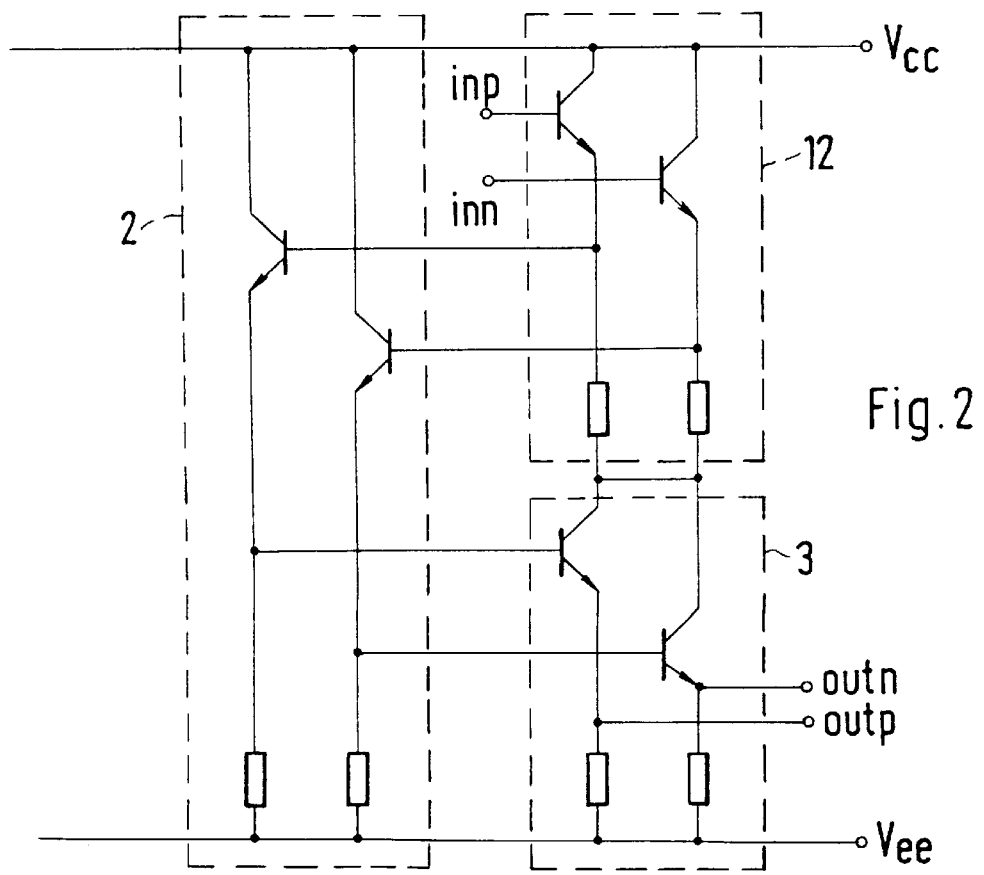
FIG. 2 is a schematic diagram of a circuit arrangement according to the invention.

FIG. 2 shows the circuit arrangement according to the invention, whose power consumption is reduced to one third that of the circuit of FIG. 1 with unchanged supply voltage and unchanged input and output conditions. This is accomplished by providing, instead of a parallel combination of three emitter followers as shown in FIG. 1, a parallel combination of only two branches as shown in FIG. 2, with one branch of this parallel combination consisting of two emitter followers 12, 3 in series, and each of the two branches having an unchanged power consumption.

Figure 3:
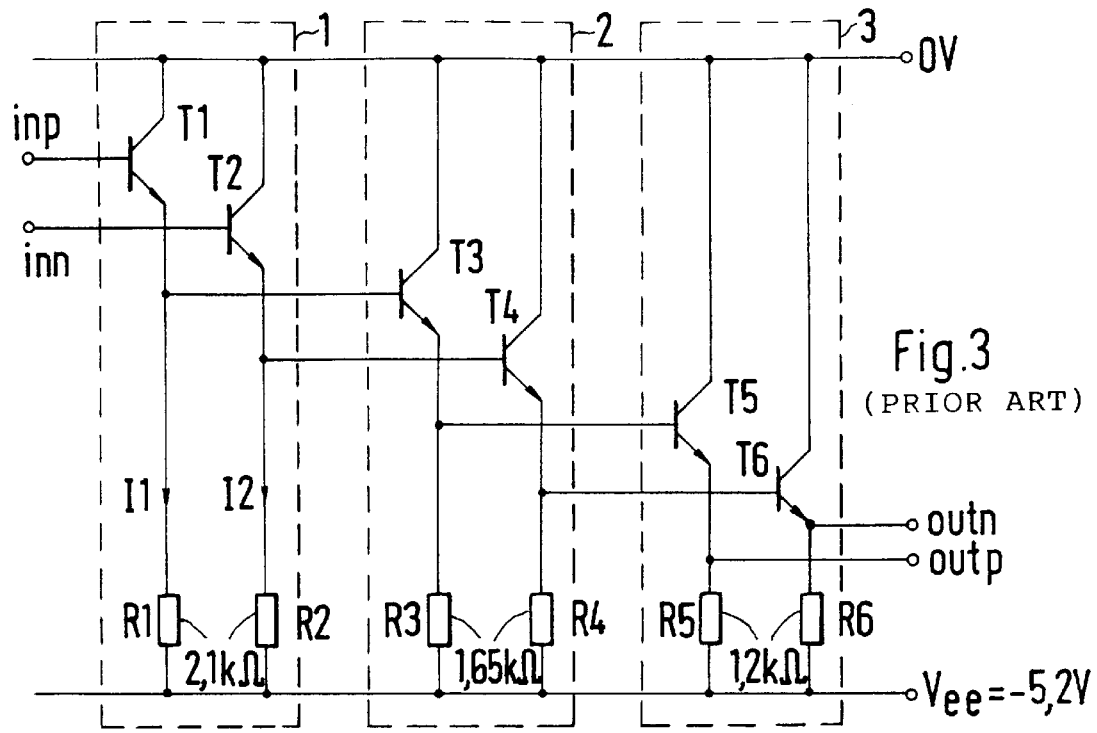
FIG. 3 is a schematic diagram of a prior-art circuit arrangement showing examples of component values.
Figure 4:
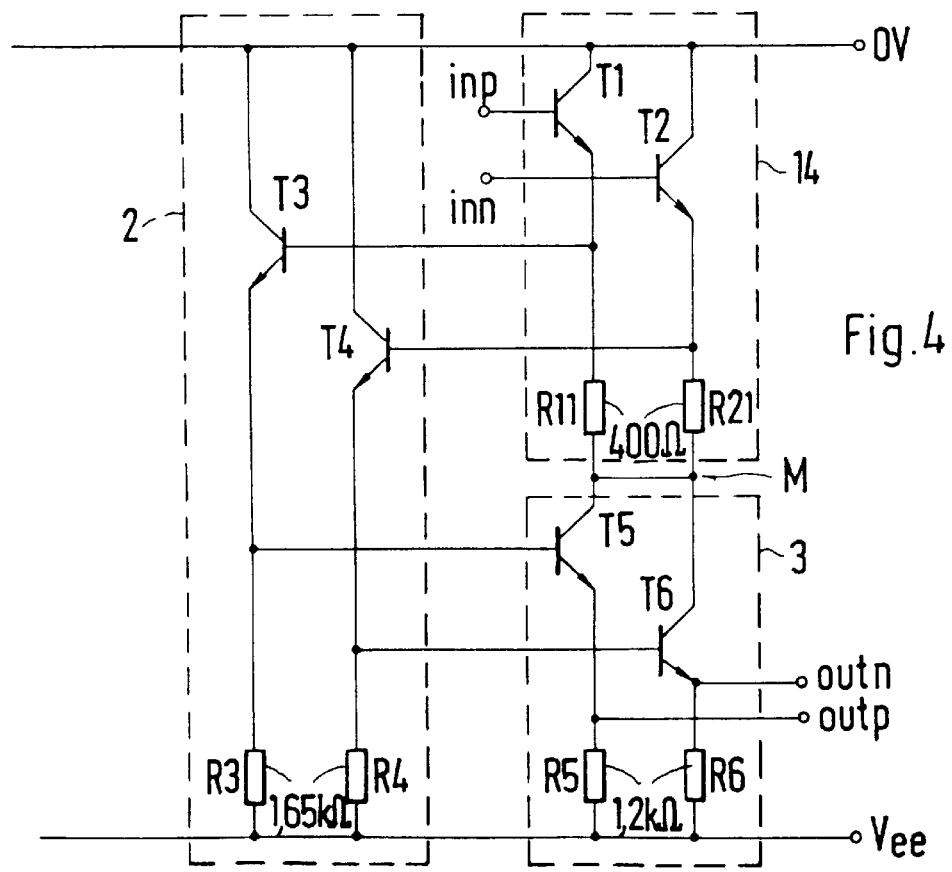
FIG. 4 is a schematic diagram of the circuit arrangement according to the invention showing examples of component values.

FIGS. 3 and 4 show component values for the circuits of FIGS. 1 and 2, respectively. The component values for the resistors are shown in the figures in the European style with commas indicative of the usual American decimal points At a supply voltage $V_{ee}$=5.2V, each of the current paths illustrated in FIG. 3 by a transistor T1, T2, T3, T4, T5, T6 and a resistor R1, R2, R3, R4, R5, R6 draws a current of I=2 mA, so that the total power consumption is 12 mA.

FIG. 4 shows the above first emitter follower 1 as a newly proportioned emitter follower 14 which is now connected in series with the third emitter follower 3 via a virtual ground M, so that the circuit arrangement according to the invent ion consists of four current paths each having a power consumption of I=2 mA. Thus, a reduction in power consumption from $I_{old}$=12 mA to $I_{new}$=8 mA is achieved with unchanged interface conditions.

Figure 5A:
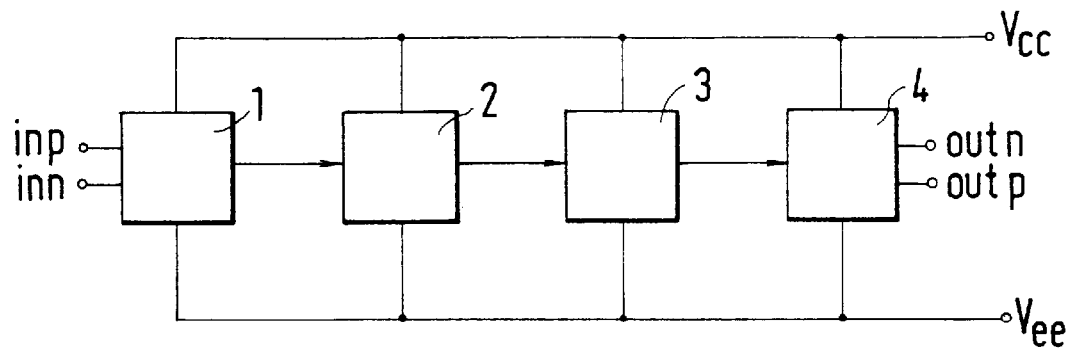
FIG. 5a is a block diagram of a prior-art multistage circuit arrangement.
Figure 5B:
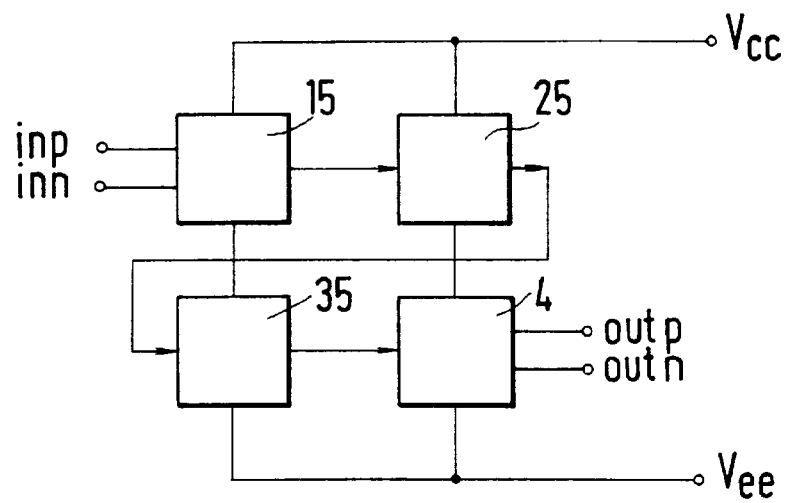
FIG. 5b is a block diagram of a multistage circuit arrangement according to the invention.

In the case of a four-stage emitter follower as shown in FIG. 5b, power consumption is reduced by 50% compared with a conventional parallel combination as shown in FIG. 5a. This necessitates newly proportioning the first stage 1, the second stage 2, and the third stage 3 of the emitter follower, which are labelled in the inventive circuit of FIG. 5b as stage 15, stage 25, and stage 35. Thus, in this example, the circuit arrangement according to the invention consists of two parallel-connected branches each containing of a series combination of two emitter followers.

It is possible to connect more than two emitter followers in series in each branch while maintaining the magnitudes of the input and output voltages, if the supply voltage permits such an implementation. The power consumption then decreases correspondingly.

It should be noted that the individual stages of the emitter followers in this embodiment are connected in parallel or parallel-series with respect to the power supply. With respect to the information transfer, the emitter followers are connected in cascade.

I claim:

1. A circuit arrangement for a digital circuit using differential logic, for use with a power supply, comprising a plurality of cascade-connected switching stages (1, 2, 3) consisting of parallel-connected current paths (I1, I2), characterized in that at least one of the switching stages (12) is connected in series with another switching stage (3) of the plurality of switching stages with respect to the power supply, but is connected purely in cascade with respect to information transfer, the connecting in series accompanied by creating a virtual ground and by re-proportioning the at least one of the series-connected switching stages compared to its proportioning when used in a purely parallel connection, whereby the number of parallel-connected current paths is reduced compared to the number of parallel-connected current paths with the same plurality of switching stages all connected in parallel, and the overall power consumed by the plurality of switching stages is also reduced compared to the overall power consumed by the same plurality of switching stages when all connected in parallel with respect to the same power supply and with the same magnitudes of the supply voltages ($V_{cc}$, $V_{ee}$), the input voltages (inp, inn), and the output voltages (outp, outn).

2. A circuit arrangement as claimed in claim 1, characterized in that in a three-stage emitter follower, a first emitter-follower stage (14) is connected in series, with respect to the power supply, with a third emitter-follower stage (3), that the third emitter-follower stage (3) is driven by the first emitter-follower stage (1) via a second emitter-follower stage (2), and that the second emitter-follower stage (2) and the series combination of the first emitter-follower stage (14) and the third emitter-follower stage (3) are connected to the supply voltage ($V_{cc}$, $V_{ee}$).

3. A circuit arrangement as claimed in claim 1, characterized in that in a four-stage emitter follower, the first emitter-follower stage (15) is connected in series, with respect to the power supply, with the third emitter-follower stage (35), and the second emitter-follower stage (25) is connected in series with a fourth emitter-follower stage (4), that these series combinations are connected to a supply voltage ($V_{cc}$, $V_{ee}$), and that information is transferred from the first emitter-follower stage (15) through the second and third emitter-follower stages (25, 35) to the fourth emitter-follower stage (4).

* * * * *